United States Patent [19]

Donovan et al.

[11] Patent Number: 4,686,627
[45] Date of Patent: Aug. 11, 1987

[54] ELECTRICAL TEST APPARATUS

[75] Inventors: William J. Donovan, San Bernardino; George G. Sanford, Los Angeles, both of Calif.

[73] Assignee: Honeywell Inc., Minneapolis, Minn.

[21] Appl. No.: 685,695

[22] Filed: Dec. 24, 1984

[51] Int. Cl.[4] ........................ G01R 15/12; G06F 1/02; G06F 15/20

[52] U.S. Cl. .............................. 364/481; 307/296 R; 324/73 AT; 364/489

[58] Field of Search ............... 364/481, 483, 488, 489, 364/490; 324/73 R, 73 AT, 73 RC; 371/20, 25; 330/145, 284; 307/296 R, 358, 573, 574

[56] References Cited

U.S. PATENT DOCUMENTS

| | | | |
|---|---|---|---|
| 3,764,995 | 11/1973 | Helf, Jr. et al. | 364/489 |
| 4,055,801 | 11/1977 | Pike et al. | 371/20 |
| 4,196,475 | 4/1980 | Hall | 364/482 |
| 4,215,420 | 7/1980 | Kassakian | 364/489 |
| 4,242,751 | 12/1980 | Henckels et al. | 371/26 |
| 4,402,055 | 8/1983 | Lloyd et al. | 371/20 |
| 4,439,858 | 3/1984 | Peterson | 371/20 |
| 4,485,472 | 11/1984 | Sproull et al. | 324/73 AT |
| 4,488,299 | 12/1984 | Fellhauer et al. | 371/20 |

Primary Examiner—Errol A. Krass
Assistant Examiner—Daniel W. Juffernbruch
Attorney, Agent, or Firm—Roger W. Jensen

[57] ABSTRACT

A test apparatus for testing such electrical circuit elements as components of printed circuit boards or integrated circuit chips includes a number of substantially indentical pin modules or units, one for each pin under test. The several modules are separately programmed by a CPU to provide a suitable state at the pin under test, i.e., excitation signal, read signal or impedance. Power to the unit under test is provided by the pin module.

1 Claim, 3 Drawing Figures

ELECTRICAL TEST APPARATUS

FIELD OF THE INVENTION

This invention relates to the field of electrical engineering, and particularly to accessory means for use in the testing and operation of electrical devices.

BACKGROUND OF THE INVENTION

One of the most complex problems facing test system design today is the need to provide system functions to each point of an electrical device or circuit under test. Common methods of doing this utilize switching systems to select a certain type of test function for each point to be tested. This switching is complex and expensive, and also generally is both physically large and consumes high levels of power. The circuitry of the switch also induces other problems and inaccuracies into the test circuit. The resistance or reactance of the switches, along with the separation of the device under test from the test equipment, all contribute this.

In the testing of large volumes of a single product it is common to find test systems designed and dedicated to this single function. If more flexibility is desired, it is sometimes possible to build a system up of standard units needing only a special interface, cable and so forth for a specific device to be tested. Beyond these application there is a wide range of what may be considered to be "universal" testers. These are customized to the testing of a specific part, not primarily by changing hardware although this is sometimes done and test heads are commonly changed, but by the changing of configuration through software.

The most common type of test system is commonly referred to as a "shared resource" design. This design uses a limited number of pieces of standard test equipment that is switched between many points of test connection by a switch matrix commonly known as a "cross-point switch". While these designs provide great flexibility in the application of proven standard test equipment, they suffer several serious limitations. The switch unit, if capable of high frequencies and high power levels in particular, is large, complex, and expensive. Its effect on the paths within the circuit may sometimes make the data collected invalid.

To solve these problems in the testing of complex, high speed parts, such as VLSI integrated circuits, some users have gone to a "tester per pin" design. This methodology duplicates all needed test equipment for each point to be tested. It can readily be seen that this design, while powerful, is priced out of all but the most demanding applications.

BRIEF DESCRIPTION OF THE INVENTION

A new test system has been created. This has been entitled "function per pin". The system configuration consists of a series of identical units, one for each point or pin under test. These are "pin modules". The modules are programmed for test setup and for the conducting of the test by a standard computer system. System power is provided by power supplies for the various computer and control circuits. Power to the unit under test is provided by the pin modules.

Various features of novelty which characterize the invention are pointed out with particularity in the claims annexed hereto and forming a part hereof. However, for a better understanding of the invention, its advantages, and object attained by its use, reference should be had to the drawing which forms a further part hereof, and to the accompanying descriptive matter, in which there is illustrated and described a preferred embodiment of the invention.

BRIEF DESCRIPTION OF THE DRAWING

In the drawing, in which like reference numerals identify corresponding parts throughout the several views.

DESCRIPTION OF THE PREFERRED EMBODIMENT

Figure 1:
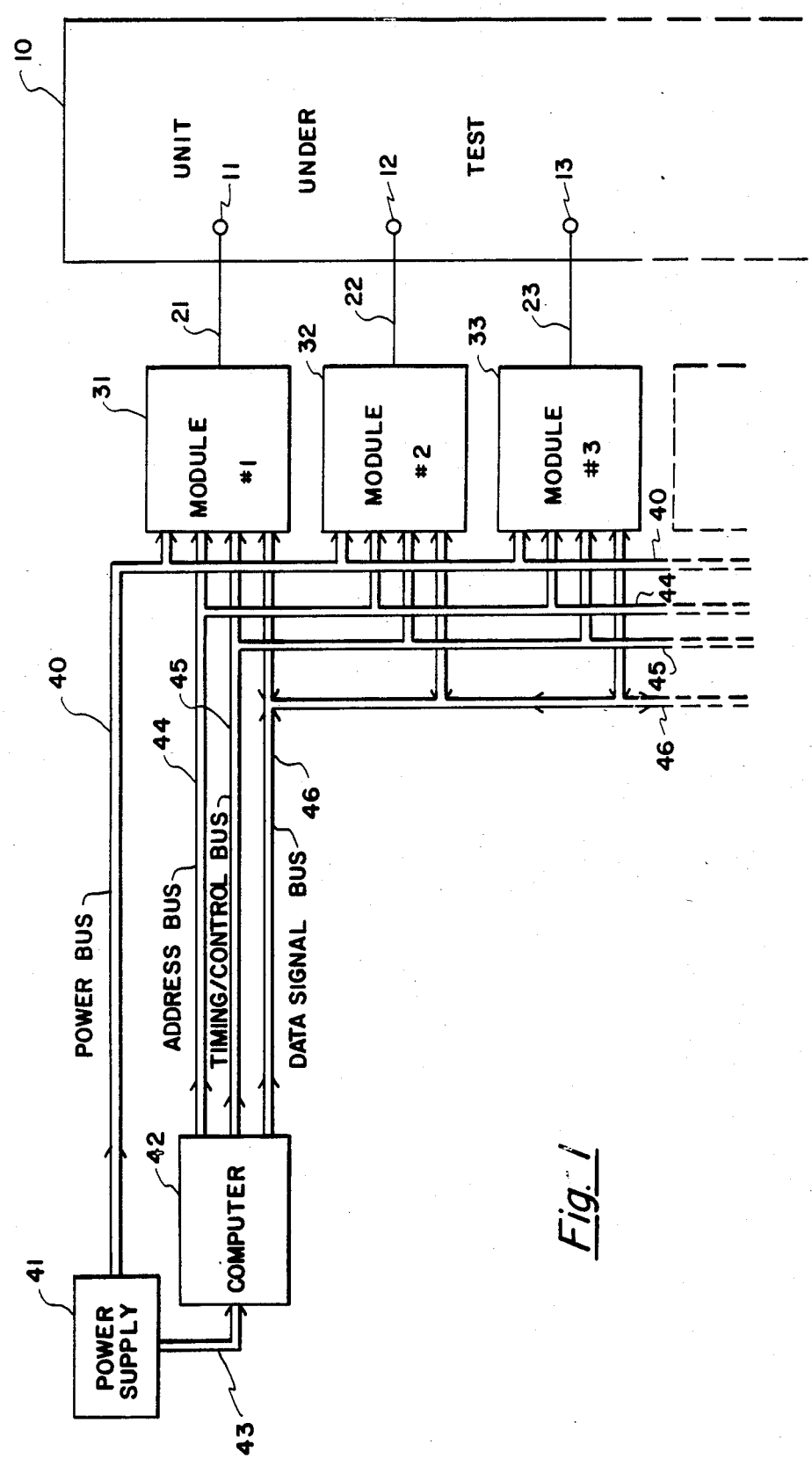
FIG. 1 is a partial block diagram of a system embodying the invention.

Turning first to FIG. 1, there is shown a unit 10 to be tested, which may, for example, be a circuit board or an integrated circuit. The nature of the circuit is not relevant here: all that is important is that it includes terminals or test pins 11, 12, 13 . . . of input or output interest. By this is meant points at which predetermined electrical enerogization or electrical loading must be supplied, or points at which predetermined signals must appear or be supplied, if the circuit is operating properly. The pins are connected by conductors 21, 22, 23 . . . to individual ones of a plurality of "pin modules" 31, 32, 33 . . . better shown in FIG. 2. Each module is energized on a power bus 40 from a power source 41, which also energizes a computer 42 on a bus 43. Computer 42 controls the operation of modules 31, 32, 33 . . . through an address bus 44 and a timing/control bus 45, and receives signals from and supplies signals to the modules on a data bus 46.

Figure 2:
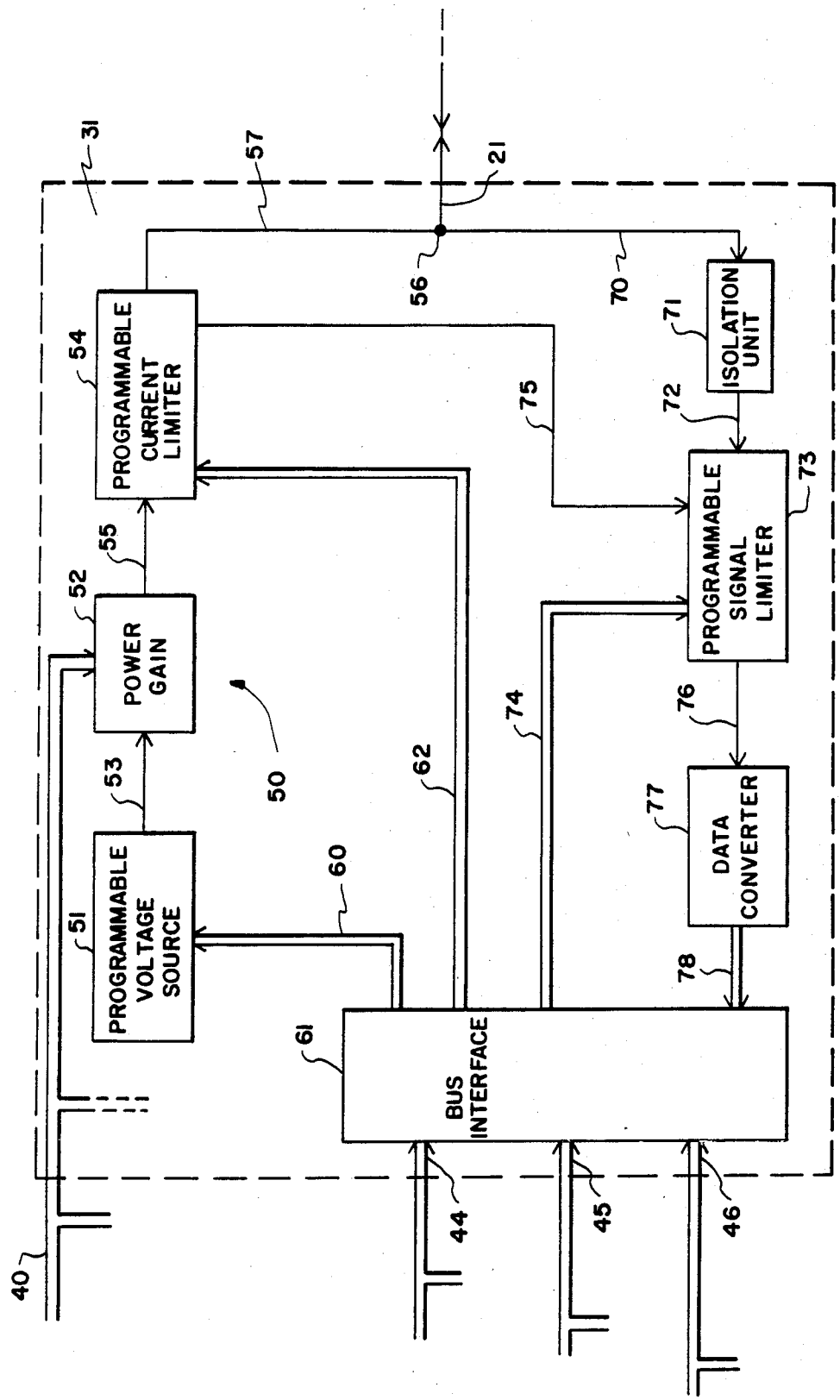
FIG. 2 is a block diagram of a "pin module" used in the invention.

Modules 31, 32, 33 . . . are identical, and are as shown in FIG. 2. Unit 31, for example, includes a programmable power distributor 50 including a programmable voltage source 51 a power gain stage 52 connected to source 51 by a conductor 53 and to power bus 40, and a programmable current limit component 54 connected to gain stage by conductor 55 and to a common output terminal 56 by conductor 57. Terminal 56 is connected to conductor 21 of FIG. 1.

Source 51 is also connected by a bus 60 to a bus interface 61 to which unit 54 is also connected by a bus 62. Interface 61 receives busses 44, 45, and 46 from computer 42 of FIG. 1.

Terminal 56 is connected by a conductor 70, an isolation unit 71, and a conductor 72 to a programmable signal processor 73, which is also connected to interface 61 through a bus 74, and which may receive an input 75 from unit 54. Processor 73 is connected by a conductor 76 to a data converter 77, which is connected by a data bus 78 with interface 61 and from there to bus 46. It will be appreciated that power supply 41, computer 42, and modules 31, 32, 33 . . . have a common ground.

Figure 3:
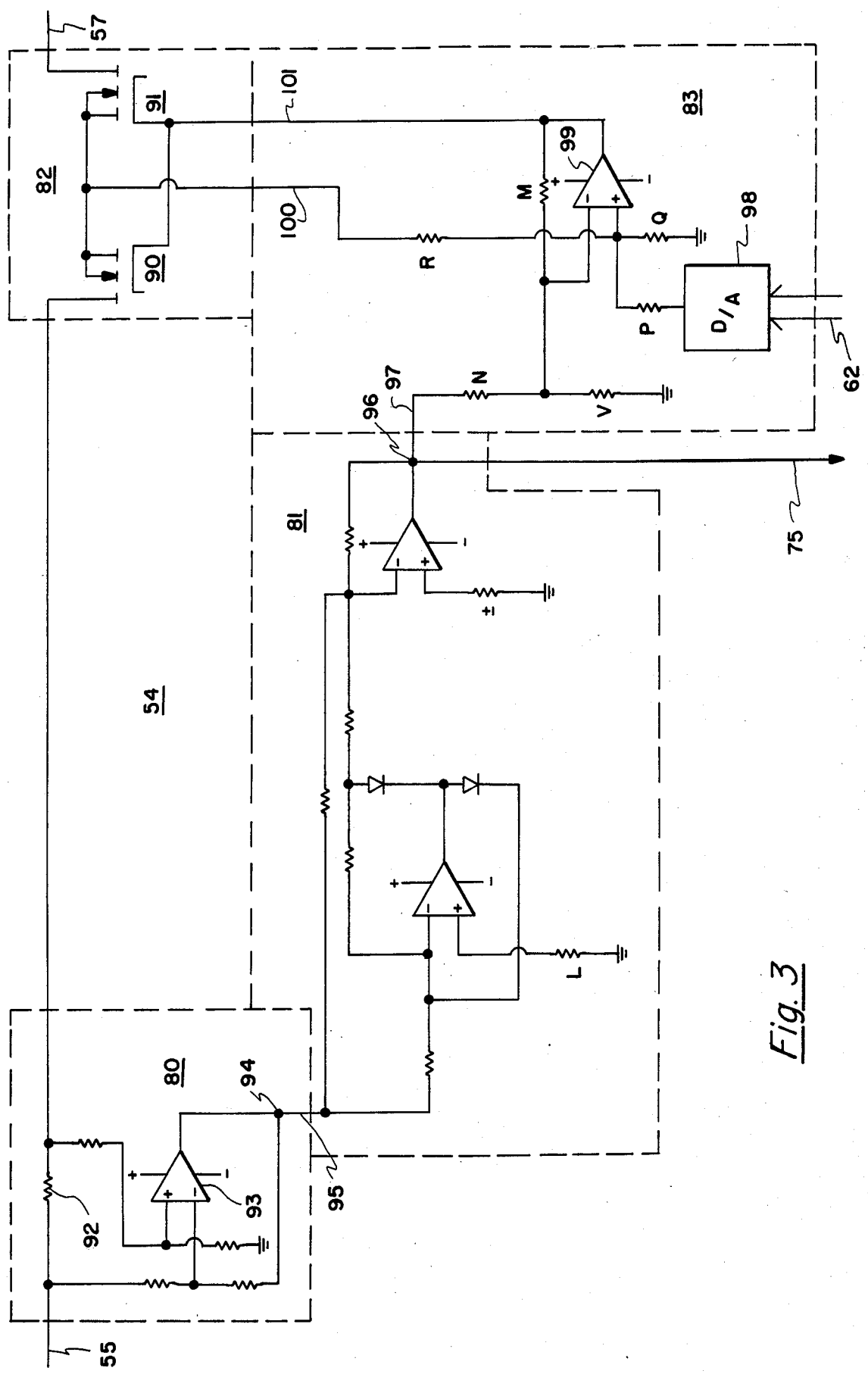
FIG. 3 is a wiring schematic of a programmable current limit component of a pin module.

It will be appreciated that if a particular module is to supply a voltage to or produce a load at its terminal 56, its processor 73 is isolated from terminal 56 by isolator 71. Likewise, if the module is to receive a signal from terminal 56, component 54 must be in a condition equivalent to an open circuit, to avoid loading the signal lines undesirably. A component suitable for this use is shown in FIG. 3 to comprise a current sensing stage 80, an absolute value stage 81, an output stage 82, and an output control stage 83. Output stage 82 comprises a pair of MOSFET transistors 90 and 91 and acts as a variable resistance element to control the flow of current in either direction between conductors 55 and 57. The current flows through a sensing resistor 92 in stage 80, which includes an operational amplifier 93. The output at terminal 94 is scaled at a desired value, such as 5 volts per ampere of current in resistor 92, a positive voltage representing flow of current from 55 to 57, and as supplied to stage 81 and conductor 95. The output at terminal 96 of stage 81 may have the same scaling, but is always positive regardless of current direction: it is supplied on conductor 75 to processor 73, and on conductor 97 as one input to stage 83: a second input is supplied through a digital-to-analog converter 98.

Stage 83 includes a differential amplifier 99 and functions as an adder-subtractor circuit, supplying to output stage 82 a source voltage on conductor 100 and a gate voltage on conductor 101. When zero current is being called for by the program, through converter 98, voltage 101 is caused to follow voltage 100, and conductor 57 is, in effect, open circuited. If a voltage from converter 98 is input, MOSFETs 90 and 91 receive a positive enhancement voltage causing them to turn on by whatever amount is needed to provide a current sensor voltage equal to the converter output voltage.

The general operation of the pin module system will now be understood. Pin modules as in FIG. 2 are connected to a minimum of two pins of the unit to be tested. The program in computer 42 acts on units 51, 54, and 73 in the various modules so that at each pin an appropriate voltage with respect to ground, including ground itself, is supplied on its conductor 57, with current limiting for safety if desired, or so that a signal expected or needed at conductor 70 is appropriately supplied or processed at unit 73, or so that a load of predetermined nature, including open and short circuits, is applied between terminal 56 and the like terminal of another module.

What is claimed is:

1. Test apparatus for testing electrical circuit components, said components each including test pins, said test apparatus comprising:

a plurality of pin modules each having a common conducting means for connection to selected ones of said test pins;

each module including a programmable power distributor, having a power output terminal, and a programmable processor unit having a signal input terminal, said power output terminal and said signal input terminal having a connection to said common conducting means, said connection between said common conducting means and said signal input terminal including an isolation unit operable to isolate said signal input terminal from said power output terminal;

said power distributor including a programmable voltage source unit, a power gain unit having an input connected to an output of said voltage source unit, and a programmable current limiter unit having an input connected to an output of said power gain unit and an output comprising said power output terminal;

a computer coupled to said modules, said computer including means for selectively programming said programmable units of said modules and means for transmitting data signals to said modules and to receive data signals from said modules;

said programmable current limiter unit including a current sensing stage, a controlled output stage, an absolute value stage and an output control stage, said current sensing stage being connected between said input of said current limiter unit and said controlled output stage to produce a voltage signal representative of the magnitude and direction of current flow controlled by said output stage, said absolute value stage being connected to convert said voltage signal to an absolute value signal irrespective of current flow direction, said absolute value signal being applied as a first input signal to said output control stage, a second input signal to said output control stage being derived from said computer, said control stage being operative in response to said first and second input signals to control the operation of said controlled output stage in accordance with programatic instructions from said computer; and means supplying said absolute value signal to said programmable signal processor for transmittal to said computer.

* * * * *